Dec. 9, 1969 SEIICHIRO SHIGAKI 3,483,478
VARIABLE AMPLIFICATION CIRCUIT
Filed June 6, 1968
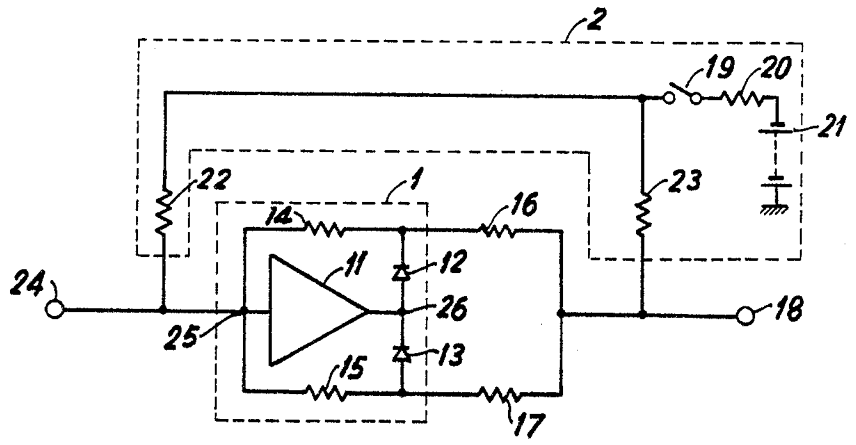
INVENTOR.
SEIICHIRO SHIGAKI
BY
Hopgood & Calimafde
ATTORNEYS

United States Patent Office 3,483,478

Patented Dec. 9, 1969

3,483,478

VARIABLE AMPLIFICATION CIRCUIT

Seiichiro Shigaki, Tokyo, Japan, assignor to Nippon Electric Company, Limited, Tokyo, Japan Filed June 6, 1968, Ser. No. 735,016

Claims priority, application Japan, June 7, 1967, 42/36,149

Int. Cl. H03f *1/36, 3/68*

U.S. Cl. 330—103 6 Claims

ABSTRACT OF THE DISCLOSURE

A variable amplifier circuit is described wherein two resistive feedback paths establishing different amplifier gain characteristics are provided about an operational amplifier. The feedback paths conduct current in opposite directions. Current is selectively subtracted from the input and returned at the output of the amplifier to render the feedback paths alternately operative and vary the gain characteristics of the amplifiers.

This invention relates to a variable amplification circuit. More specifically, it relates to a variable amplification circuit for an analog-to-digital converter.

The variable amplification circuit which is contemplated herein is an amplifier or attenuator in which an amplification or an attenuation factor can be transferred at high velocity and precision in an analog-to-digital converter having logarithmic partly compressed and partly expanded non-linear characteristics.

A conventional amplifier or attenuator of this kind ordinarily utilizes semiconductors such as diodes and transistors for the transferring operation. Since these semiconductor elements are connected in series or in parallel with the main signal circuit, the effects of the deviation of the residual voltages and the residual resistances in the impedance system and switches and of the signal level variation could not be avoided. Thus, it is difficult to satisfy both requirements of high velocity transfer and high precision in the amplification or attenuation factor.

Therefore, the primary object of the present invention is to obtain an amplifier or an attenuator circuit which can overcome the above described difficulties and preserve the high velocity transferring nature and the high precision amplification or attenuation factor simultaneously.

It has been already proposed that a diode is utilized in the feedback circuit of an amplifier having a high amplification factor so that the residual errors, for instance, due to a diode switch may be minimized (Japanese patent publication No. 15,567/1965 corresponding to U.S. Patents Nos. 3,145,377 and 3,187,325.

By utilizing such circuit in the present invention, an amplifier having high velocity and high precision variable amplification factor is thereby obtained.

The invention will be better understood by the following description taken in conjunction with the accompanying drawing, in which a simplified diagram of an example of the variable amplification circuit according to this invention is illustrated.

In the drawing, numeral 1 designates an example of the circuit described in the above described Japanese patent publication No. 15,567/1965 and having the characteristic feature that its feedback circuits are transferred in accordance with the polarity of the input current. Numeral 2 designates a switching and coupling circuit provided for the purpose of employing the circuit 1 as a variable amplification circuit.

In the circuit 1, numeral 11 designates an amplifier of phase reversible and of high voltage and high current gain, and the first feedback circuit consisting of a diode 12 and a resistor 14 connected in series is connected between the output point 26 and the input point 25. Likewise, the second feedback circuit consisting of a series connected diode 13 and a resistor 15 is connected between the output point 26 and the input point 25. The diode 12 is connected in the direction where the current can flow only from the point 26 to the resistor 14, and the diode 13 is connected reversely so that the current may flow from the resistor 15 to the point 26. Resistors 16 and 17 are the coupling resistors connecting the output terminal 18 to the circuit 1.

In the circuit 2, numeral 19 designates a switch for transferring the amplification factor of the amplifier, one side of which is connected through a resistor 20 to a constant voltage source 21, and the other side of which is connected through the resistors 22 and 23 to the input terminal 24 and the output terminal 18, respectively.

It is supposed that the input current for the amplifier circuit 1 is $I_i$, the output current from the output terminal 18 is $I_o$, the resistance values of 14 and 15 $R_{F1}$ and $R_{F2}$, respectively, the same values of 16 and 17 are $R_{I1}$ and $R_{I2}$, respectively, the values of 20, 22 and 23 are $R_S$, $R_{S1}$ and $R_{S2}$, respectively, and the voltage of the constant voltage source 21 is $E_S$. The amplifier 11 is of high voltage and high current gain so that when I1 is positive the input voltage and current to the amplifier 11 can be neglected in comparison with the finite values of the output voltage and current. Hence, the input point 25 is generally equal to 0 potential with the input current selectively flowing through one of the feedback resistors 14 and 15. When the switch 19 is opened, the resistors 22 and 23 are connected between the zero potential point 25 and the output terminal 18 and have no effect on the function of the circuit. Because the input current $I_i$ of the circuit 1 is positive, the feedback current flows only through the resistor 15 and the diode 13 in the second feedback circuit. Hence the output current $I_o$ is expressed as $$I_o + \frac{R_{F2}}{R_{I2}} I_i$$

(when the switch 19 is opened).

When the switch 19 is closed, a current $$\frac{R_{S2} \cdot E_S}{R_S(R_{S1}+R_{S2})+R_{S1} \cdot R_{S2}}$$

is subtracted from the input current $I_i$ by the voltage $E_S$ of the source 21 at the point 24, and the input current to the circuit 1 can be expressed as $$I_i - \frac{R_{S2} \cdot E_S}{R_S(R_{S1}+R_{S2})+R_{S1} \cdot R_{S2}}$$

If the values of $E_S$, $R_S$, $R_{S1}$, $R_{S2}$ are selected to such values that the latter term is made larger than the former term $I_i$, the input current into the circuit 1 becomes a negative value, and the feedback current flows only through the first feedback circuit consisting of the resistor 14 and the diode 12.

Hence, the output current $I_o$ is expressed as $$I = \frac{R_{F1}}{R_{I1}} I - \frac{R_{S2} \cdot E_S}{R_S(R_{S1}+R_{S2})+R_{S1} \cdot R_{S2}} \cdot \frac{R_{F1}}{R_{I1}} + \frac{R_{S1} \cdot E_S}{R_S(R_{S1}+R_{S2})+R_{S1} \cdot R_{S2}}$$

and is $R_{S1}/R_{S2}$ is selected so that $R_{F1}/R_{I1} = R_{S1}/R_{S2}$, $I_o$ can be $$I_o = \frac{R_{F1}}{R_{I1}} I_i$$

(when the switch 19 is closed). That is to say, the amplification factor of the circuit can be transferred between the two values; $R_{F2}/R_{I2}$ and $R_{F1}/R_{I1}$ by means of switch 19.

Since no signal current flows through the switching circuit, the amplification factor can be determined only by the six resistors $R_{S1}$, $R_{S2}$, $R_{F1}$, $R_{F2}$, $R_{I1}$, and $R_{I2}$, and the characteristic feature of not being affected by the switching circuit constants $E_S$, $R_S$ is obtained. Thus, a high precision amplifier circuit which can be transferred at high velocity is provided.

Although an embodiment of the present invention has been described in conjunction with a conventional operational amplifier, it is apparent that the invention can be used with any other amplifier circuit to provide it with different amplification factors depending on the positive or negative polarity of the input signal, and these are all included in the scope of the present invention.

I claim:

1. A variable amplification circuit comprising, an operational amplifier, means including a first unidirectional current resistive feedback path from the output to the input of the amplifier for producing a first amplifier gain characteristic, means including a second unidirectional current resistive feedback path from the output to the input of the amplifier for producing a second amplifier gain characteristic, said feedback paths providing opposite feedback current flows relative to one another and alternately rendered operative, means providing a change of current flow at the input of the amplifier and cancelling the effect of said change at the output of the amplifier, said change in current being sufficient to effectively transfer the operative feedback from one of said paths to the other path.

2. The device as recited in claim 1 wherein said current changing means comprises a current source, a first resistor coupling the current source effectively to the input of the amplifier, a second resistor coupling the current source effectively to the output of the amplifier, with the ratio of said first and second resistors bearing a preselected relationship with respect to the first amplifier gain characteristic, and switch means for selectively coupling the current source to the amplifier input and the outputs to render the first feedback path operative and the second feedback path inoperative.

3. The device as recited in claim 2 wherein said first amplifier gain-characteristic-producing means includes, a first feedback resistor effectively coupled across the amplifier, a first unidirectional current device coupling the output of the amplifier to the first feedback resistor, and a first output resistor coupled to the common junction of the first unidirectional current device and the first feedback resistor, and wherein said second amplifier gain characteristic device includes, a second feedback resistor effectively coupled across the amplifier, a second unidirectional current device coupling the output of the amplifier to the second feedback resistor, and a second output resistor coupled to the common junction of the second unidirectional current device and the second feedback resistor, and wherein the second resistor couples the current source to the amplifier output through said output resistors and said unidirectional current device.

4. The device as recited in claim 3 wherein the ratio of said first and second resistors is adjusted to bear a preselected relationship with a corresponding ratio of the first feedback resistor and the first output resistor.

5. The device as recited in claim 4 wherein the ratio of the first resistor to the second resistor is equal to the ratio of the feedback resistor to the output resistor.

6. The device as recited in claim 1 wherein said amplifier feedback paths normally retain the amplifier input substantially at zero volts.

References Cited

UNITED STATES PATENTS 3,252,007 5/1966 Saari ............... 307—230

ROY LAKE, Primary Examiner

JAMES B. MULLINS, Assistant Examiner

U.S. Cl. X.R.

307—230; 330—110